United States Patent [19]

Srinivasan

[11] Patent Number: 5,777,474
[45] Date of Patent: Jul. 7, 1998

[54] RADIO-FREQUENCY COIL AND METHOD FOR RESONANCE IMAGING/ANALYSIS

[75] Inventor: Ravi Srinivasan, Richmond Heights, Ohio

[73] Assignee: Advanced Imaging Research, Inc., Cleveland, Ohio

[21] Appl. No.: 745,893

[22] Filed: Nov. 8, 1996

[51] Int. Cl.$^6$ .................................................. G01V 3/00
[52] U.S. Cl. ............................................ 324/318; 324/322
[58] Field of Search ................................. 324/318, 322, 324/314, 307; 128/653.5

[56] References Cited

U.S. PATENT DOCUMENTS

| | | | |
|---|---|---|---|
| 4,411,270 | 10/1983 | Damadian | 324/309 |
| 4,793,356 | 12/1988 | Misic et al. | 324/318 |
| 4,799,016 | 1/1989 | Rezvani | 324/318 |
| 4,820,985 | 4/1989 | Eash | 324/318 |
| 4,825,162 | 4/1989 | Roemer et al. | 324/318 |
| 4,833,409 | 5/1989 | Eash | 324/318 |
| 5,057,778 | 10/1991 | Rath | 324/318 |
| 5,144,240 | 9/1992 | Mehdizadeh et al. | 324/318 |
| 5,258,717 | 11/1993 | Misic et al. | 324/318 |
| 5,270,656 | 12/1993 | Roberts et al. | 324/318 |
| 5,382,903 | 1/1995 | Young | 324/318 |
| 5,521,506 | 5/1996 | Misic et al. | 324/318 |

OTHER PUBLICATIONS

"A Comprehensive Analysis for Estimating Modes in Couples Resonators" by Ravi Srinivasan and Haiying Liu published in the 4th Scientific Meeting of the International Society Magnetic Resonance in Medicine. Book of Abstracts, New York, Apr. 27–May 3, 1996, p. 1425.

"Examples of the Design of Screened and Shielded RF Receiver Coils" by Michael Burl and Ian R. Young Copyright 1996 by Williams and Wilkins from Robert Steiner Magnetic Resonance Unit, Hammersmith Hospital, London, United Kingdom MRM36:326–330 (1996).

*Primary Examiner*—Louis M. Arana
*Attorney, Agent, or Firm*—Renner, Otto, Boisselle & Sklar, P.L.L.

[57] ABSTRACT

An RF coil which includes an RF coil primary, an RF coil secondary, and coupling impedances that connect the two at several points along the coil peripheries. The coupling impedances are primarily reactive, and may be fixed or variable, depending on the purpose of use.

17 Claims, 9 Drawing Sheets

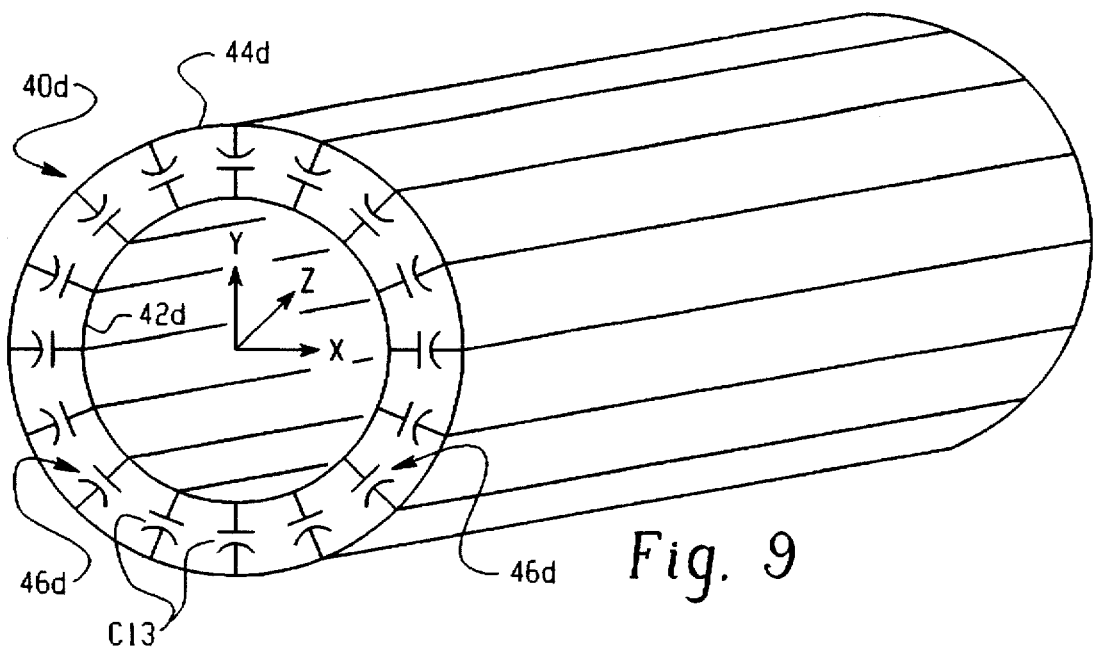
Fig. 9
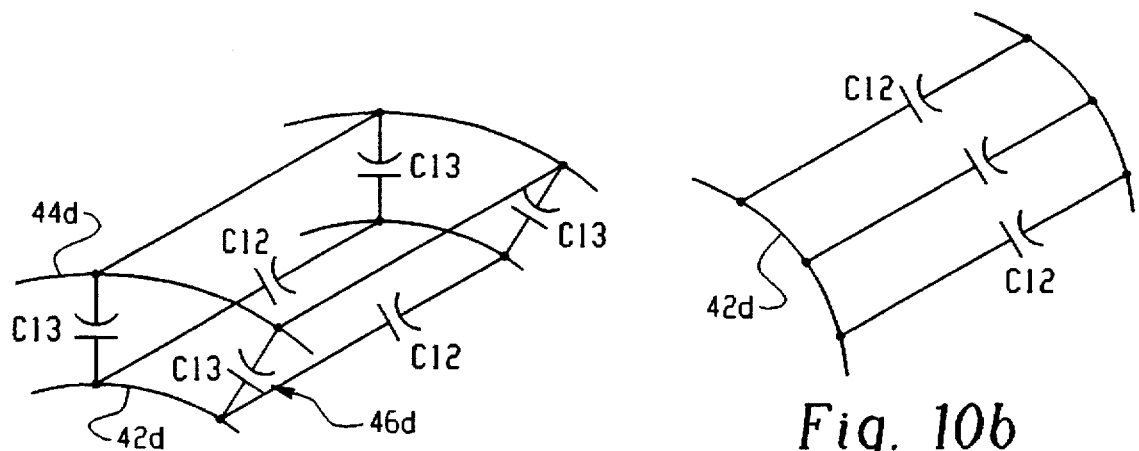
Fig. 10a
Fig. 10b
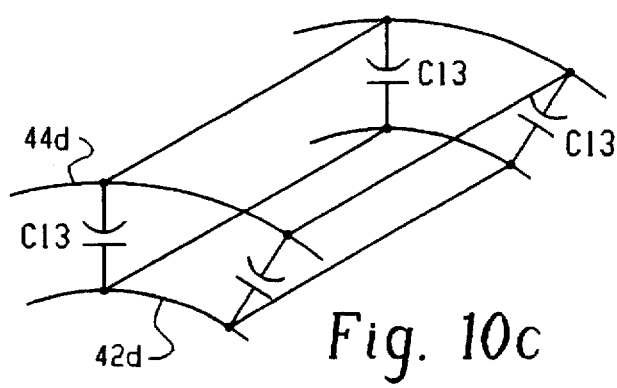
Fig. 10c

RADIO-FREQUENCY COIL AND METHOD FOR RESONANCE IMAGING/ANALYSIS

TECHNICAL FIELD

The present invention relates to resonance systems such as magnetic resonance imaging (MRI) systems, and more particularly to a radio-frequency (RF) coil and method for use in such systems.

BACKGROUND OF THE INVENTION

In MRI systems or nuclear magnetic resonance (NMR) systems, a static magnetic field $B_o$ is applied to the body under investigation to define an equilibrium axis of magnetic alignment in the region of the body under examination. An RF field is then applied in the region being examined in a direction orthogonal to the static $B_o$ field direction, to excite magnetic resonance in the region, and resulting RF signals are detected and processed. Generally, the resulting RF signals are detected by RF coil arrangements placed adjacent to the body. See for example, U.S. Pat. No. 4,411,270 to Damadian and U.S. Pat. No. 4,793,356 to Misic et al. Typically such RF coils are either surface type coils or volume type coils, depending on the particular application. Normally separate RF coils are used for excitation and detection, but the same coil or an array of coils may be used for both purposes. For multiple surface RF coils for use in NMR, see U.S. Pat. No. 4,825,162 to Roemer, et al., and for multiple volume RF coils for use in NMR, see U.S. Pat. No. 5,258,717 to Misic, et al.

A surface or volume RF coil is frequently used in examining the anatomy under investigation to obtain, for example, an image or spectroscopic or vascular data of the right symptomatic knee. The RF coil is placed very close to the symptomatic knee, adjacent the region to be imaged. Unfortunately, conventional RF coil arrangements suffer from the disadvantage that the RF coil picks up noise signals from around the region of interest (e.g., from the contralateral asymptomatic knee). This often results in a reduced overall signal-to-noise ratio (S/N) from the region of interest. Similar problems occur when imaging the breasts. Yet another example is when imaging the torso, with the arms close to the torso, or vice versa. Such problems are due in part to the fact that the range of the RF coil (i.e., the field of view (FOV) of the RF coil) covers a larger volume than the region of interest. In other words, the coil FOV is larger than the desired FOV. This is because the B field profile of the typical RF coil changes gradually in all directions due to the magnetic field properties.

Attempts have been made to alleviate such problems by way of flux rejection. See U.S. Pat. No. 5,382,903 to Young, and Burl and Young, Magnetic Resonance of Medicine, 36:326-330, 1996. The Young patent describes a mutually coupled resonant loop used to "buck" or reject the field generated by the receiving RF coil to a minimum outside the imaging FOV. Although the extent of the mutual coupling could be altered to a certain extent by changing the resonance of the flux rejecting loop, the induced currents depend primarily on the mutual coupling between coils which is a function of the physical separation between coils. The closer the respective coils the greater the coupling; and the greater induced currents resulted in improved RF screening. However, the opposite induced currents in the flux rejecting loop reduced the net signal intensity drastically over the imaging FOV of the coil. This extent varied with different coil spacings, which also affected the screening efficiency.

For example, FIG. 1a is a loop type coil 20 commonly used for several NMR applications. The coil 20 is resonated at the NMR frequency with three similar capacitors with values C1 and two capacitors with values 2C1. The rectangular loop serves as an inductance and resonates with a capacitance of approximately C1/4 at the NMR frequency. The center point between the two 2C1 capacitors is a virtual ground point VG and is forced to the real ground. This prevents any currents on the shields of the coaxial cables and therefore obviates the need for cable traps. The voltage across one of the 2C1 capacitors is matched to 50 ohms using a reactive network and fed to a preamplifier prior to system amplification and digitization (not shown).

The square box across the C1 capacitor represents a decoupling network 22 used for decoupling the RF coil during RF transmit. The number of decoupling networks 22 used in the RF coil 20 depends on the size of the RF coil and the degree of decoupling needed to minimize image artifacts and allow for safe preamplification operation. Additional circuitry may be used between the RF coil 20 and the preamplifier to reduce the amount of RF energy seen at the input of the preamplifiers during whole body RF transmit.

As shown in FIG. 1b, the decoupling network 22 consists of an inductor L1 and a pin diode D1. The pin diode D1 can be forward or reverse biased using programmable DC signals from the MRI system. Normally the pin diodes D1 will be forward biased such that the L1-C1 circuit is resonant at the NMR frequency. This will create a parallel trap, which will present an open circuit with respect to the transmitting RF currents. During receive the pin diode D1 is reverse biased. Therefore, the L1-D1 circuit will effectively be open, and the RF coil will be resonant (with C1) at the NMR frequency.

FIG. 2 illustrates an RF loop coil 30 as described in the aforementioned Burl and Young article. Here, a secondary loop 34 is placed on one side of an RF coil primary 32. Both loops 32 and 34 are magnetically coupled through space, and hence are mutually coupled to one another. The primary loop 32 is resonant with capacitance C2 and the secondary loop 34 is resonant with a capacitor C3. Together the coil 30 is tuned to the NMR frequency. The capacitors in the primary and secondary loops are paralleled and include similar decoupling networks 22 as in FIG. 1. Although the mutual coupling between the primary and secondary loops can be varied to a certain extent by varying the resonance frequency of the secondary loop (by varying C3), the mutual coupling between the primary and the secondary loop 32 and 34 is primarily dominated by the magnetic coupling and hence their proximity to one another. The range of mutual coupling between the two loops by way of changing the resonance of the secondary loop is small. Although, a greater range may be obtained by physically moving the secondary loop, having moving coils in a RF coil package has not been a practical solution. Also, the closer the secondary loop the greater will be the induced currents. Since the currents induced would be opposite in direction from the RF coil primary, this will substantially reduce the net signal from the imaging FOV, which is not desirable.

Additional shortcomings associated with conventional RF coils have arisen due to limited control of the overlap between volume and surface type RF coils in the imaging FOV. Without the ability to control the extent of FOV overlap, particularly with regard to providing asymmetric overlap, a reduced usable imaging FOV results in a reduced filling factor which causes a reduced S/N. Furthermore, oftentimes it is desirable that an RF coil be tunable at two or more different NMR frequencies. However, conventional RF coils capable of being tuned at different frequencies either require traps for multiple tuning and/or result in significantly different FOVs at the different frequencies.

In view of the aforementioned shortcomings associated with conventional RF coil designs, there is a strong need in the art for an RF coil and method which provide the ability to vary the currents in the RF coil, such as to provide adequate RF screening, without significantly compromising S/N in the imaging FOV. Moreover, there is a strong need in the art for an RF coil arrangement and method which provides a high S/N over the imaging FOV by allowing an asymmetric overlap between volume and surface coils. In addition, there is a strong need in the art for an RF coil and method which provides for multiple tuning with similar B field profiles in the different NMR frequencies over the imaging FOV, without the use of traps.

SUMMARY OF THE INVENTION

The present invention provides an RF coil with a high S/N over the imaging FOV which is highly desirable for several MR studies (e.g., anatomical, angiographic, functional, spectroscopic). The RF coil of the present invention exhibits adequate RF screening without significantly compromising S/N over the imaging FOV. Moreover, the RF coil provides a high S/N and a high degree of B field homogeneity over the imaging FOV, by facilitating a unique combination of volume and surface coils. In addition, the RF coil may be multiply tuned for operation at two or more different NMR frequencies while providing high S/N and similar B field profiles over the imaging FOV.

In particular, the RF coil of the present invention provides the ability to control the currents in the RF coil to provide efficient RF screening, facilitates asymmetric overlap between surface and volume coils in an array to obtain high S/N, and allows for simultaneous multiple frequency operation. Specifically, the RF coil of the present invention provides high degree of RF screening without substantially compromising S/N over the imaging FOV; high S/N over the imaging FOV, by providing asymmetric overlap between volume and surface coils; and high S/N and similar FOV's at the different NMR frequencies, by allowing currents at the different NMR frequencies to flow through the RF coil primary. The RF coil exhibits a modified current distribution which is different from the prior art.

The RF coil generally includes an RF coil primary, an RF coil secondary, and coupling impedances that connect the two at several points along the coil peripheries. The coupling impedances are primarily reactive, and may be fixed or variable, depending on the purpose of use.

The RF coil includes, but is not limited to, single or multi-channel operation. The RF coil may be a surface or volume type coil and may be singly or multiply tuned for use in NMR or other resonance systems. A surface coil design is best suited for breast, shoulder and torso imaging, whereas a volume coil is best suited for whole body, head, knee and wrist imaging, etc. Scaled down versions may be used to image pediatric and premature neonates. Other applications that will benefit from the RF coil of the present invention are MR angiography, spectroscopy, functional and interventional MRI. The RF coil itself may be used for transmit (T), receive (R), or transmit/receive (T/R) purposes, or may be used in conjunction with local gradients for very high-resolution imaging.

According to one particular aspect of the invention, a radio-frequency (RF) coil for resonance imaging/analysis is provided. The RF coil includes an RF coil primary sensitive to RF signals produced during resonance imaging/analysis, the RF coil primary having a usable field of view; an RF coil secondary positioned physically adjacent the RF coil primary at a predetermined distance apart and mutually coupled to the RF coil primary at a frequency of the RF signals; and coupling impedances electrically connecting the RF coil primary to the RF coil secondary to regulate an amount of current induced in the RF coil secondary at the frequency, and to form current loops between the RF coil primary and the RF coil secondary serving to redirect at least a substantial portion of flux back into the useable field of view which would otherwise impinge on the RF coil secondary in the absence of the coupling impedances.

According to another aspect of the invention, a radio-frequency (RF) coil apparatus for resonance imaging/analysis is provided which includes an RF volume coil sensitive to RF signals produced during resonance imaging/analysis; and an RF surface coil, also sensitive to the RF signals, physically positioned relative to the RF volume coil to share a common axis and to produce an overlap of the magnetic B fields of the respective coils at a frequency of the RF signals.

In accordance with still another aspect of the invention, a multiple tuned RF coil is provided which includes an RF coil primary having a usable field of view; an RF coil secondary physically adjacent the RF coil primary and mutually coupled to the RF coil primary; and coupling impedances electrically connecting the RF coil primary to the RF coil secondary to regulate an amount of current flowing between the RF coil primary and the RF coil secondary, wherein the RF coil is tuned to resonate at a plurality of different RF signal frequencies produced during resonance imaging/analysis.

According to still another aspect of the invention, an RF coil is provided which includes an RF coil element having a surface covered with a precious metal selected from a group including gold and platinum.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 4b is a schematic diagram of a secondary decoupling circuit for use in the RF coil of FIG. 4a;

FIG. 9 is a general schematic diagram of a quadrature, singly or multiply tuned volume RF coil in accordance with a fifth embodiment of the present invention;

FIG. 10a is a detailed schematic diagram of an individual repeating element making up the RF coil of FIG. 9;

FIG. 10b is an equivalent model of the individual repeating element of FIG. 10a at a low NMR frequency;

FIG. 10c is an equivalent model of the individual repeating element of FIG. 10a at a high NMR frequency;

DESCRIPTION OF THE PREFERRED EMBODIMENTS

Figure 1A:
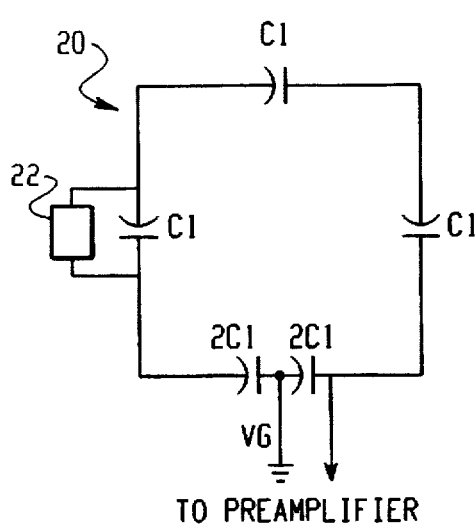
FIG. 1a is a schematic diagram of a conventional loop-type receive only NMR coil.

The present invention will now be described with reference to the drawings. wherein like reference numerals are used to refer to like elements throughout.

The present invention relates to an RF coil and a method for modifying the magnetic B field profile for a RF coil to provide adequate RF screening on one side of the RF coil without significantly compromising S/N over the imaging FOV. The RF coil includes an RF coil primary and an RF coil secondary. The RF coil primary and secondary are coupled to each other by mutual inductance and by one or more coupling impedances as discussed below in connection with FIG. 3. The B field of the RF coil may be altered by making the currents in the RF coil secondary either inductive or capacitive. for example. so as to provide a symmetric or an asymmetric field. In doing so. the RF coil can also be multiply tuned. Should performance be critical at the low gamma nucleus. the reactive impedances such as the capacitors in the RF coil will be distributed such that most of the low frequency currents will circulate in the RF coil primary with very little currents in the RF coil secondary. At the higher NMR frequency or frequencies, the RF coil primary will behave as an RF short letting all the high frequency currents flow through. Such a coil is thus capable of simultaneous operation at multiple NMR frequencies. The symmetric or asymmetric B field profile may also be used to facilitate a symmetric or asymmetric overlap between coils in an array, and to provide a high S/N and a high degree of B field homogeneity over the imaging FOV.

The RF coil of the present invention is described herein by way of illustrative embodiments. Briefly summarizing the respective embodiments, the first embodiment is discussed below in connection with FIG. 4a and includes a planar loop type RF coil primary and a planar loop type RF coil secondary. The RF coil secondary is similar in dimension and is disposed on one side to the RF coil primary so as to screen one side of the RF coil primary. with the imaging FOV on its other side. The RF coil primary and secondary are electrically coupled together by coupling impedances distributed about their peripheries. Such an RF coil represents a linear surface type coil.

The second embodiment of the present invention is a linear surface coil array for uni or bi-lateral breast imaging as discussed below in connection with FIG. 5. The array includes two solenoid type RF coil primary loops surrounded respectively by two identical but larger diameter solenoidal RF coil secondary loops. bridged by capacitances distributed around the coil peripheries. The capacitances may be fixed or variable to adjust the currents on the respective RF coil secondaries. and may also be used for tuning the RF coils to the NMR frequency.

The third embodiment is described in connection with FIG. 6 below. The RF coil includes an eight leg. distributed capacitance-inductance type RF coil primary, and an identical RF coil secondary placed adjacent along a common coaxial axis connected by eight capacitors that bridge the gap between the RF coil primary and the RF coil secondary along the coil periphery. In this special case. the virtual ground points of the RF coil primary and secondary are tied together to serve as a common ground point. This coil represents a quadrature surface type coil.

Figure 6:
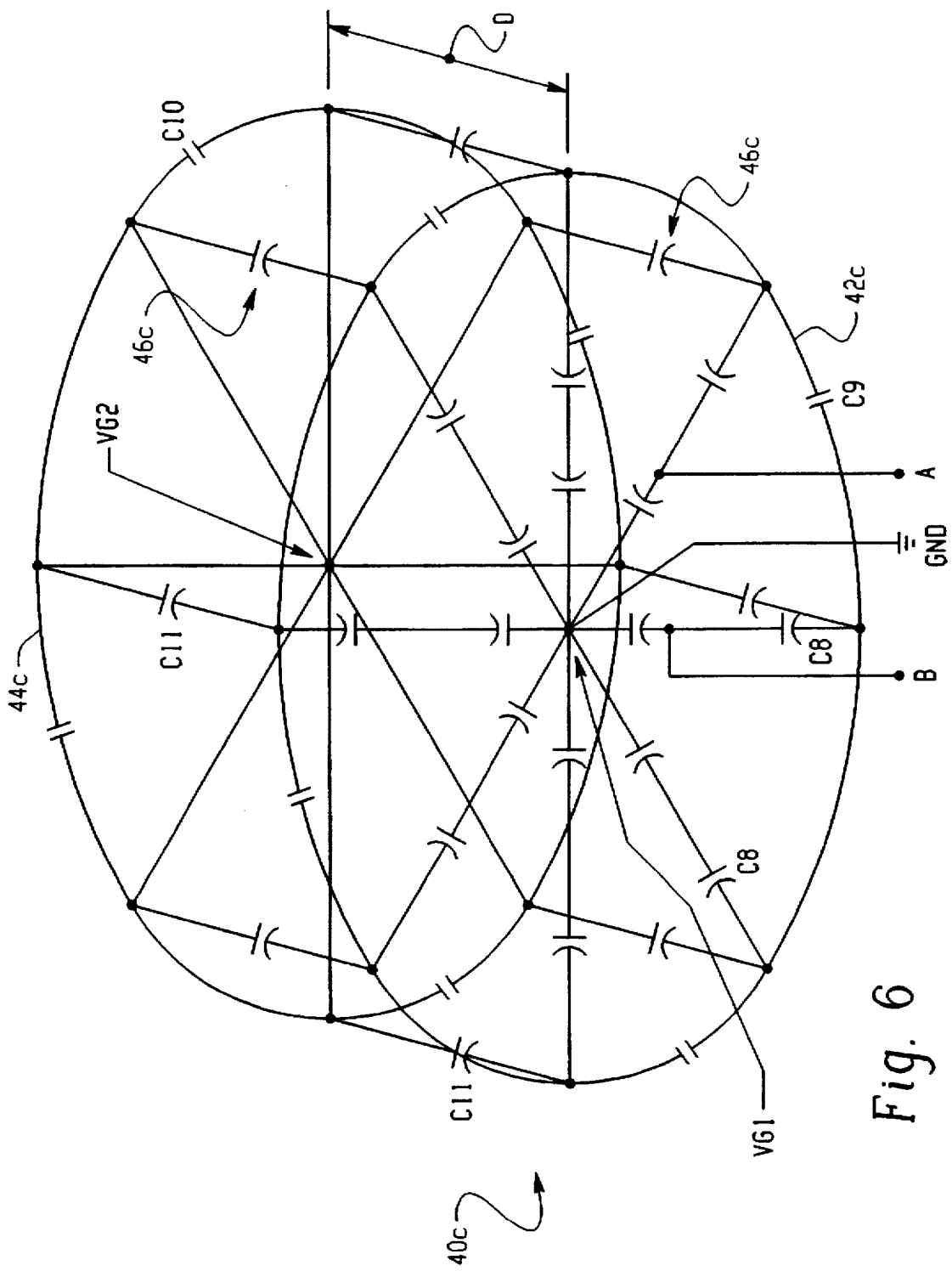
FIG. 6 is a schematic diagram of a quadrature surface type RF coil in accordance with a third embodiment of the present invention.

According to another aspect of the invention. the surface type RF coil which is described in connection with FIG. 6 is combined with a volume type coil. As is discussed below in relation to a fourth embodiment shown in FIG. 8b. the B field profile of the surface type RF coil is overlapped in an asymmetric fashion along the coil axis with a birdcage type volume coil. The net mutual coupling or mutual inductance between the surface and volume coils is virtually zero. This helps to provide improved S/N and B field homogeneity in the imaging FOV. e.g.. over portions of the top of the head, when compared to a conventional birdcage type head coil.

The fifth embodiment is described below in relation to FIG. 9. The RF coil is represented by a 16 leg. birdcage type RF coil primary, and a 16 leg birdcage type RF coil secondary placed coaxially with a larger diameter. The RF coil primary and secondary are connected by 32 capacitors distributed along the end rings. Such embodiment represents a quadrature volume coil type. The RF coil may be a multiply tuned volume coil capable of simultaneous operation at two or more different frequencies. For example. the coil may be tuned to operate at the $^1$H and $^{31}$P frequencies for MR spectroscopy.

Figure 3:
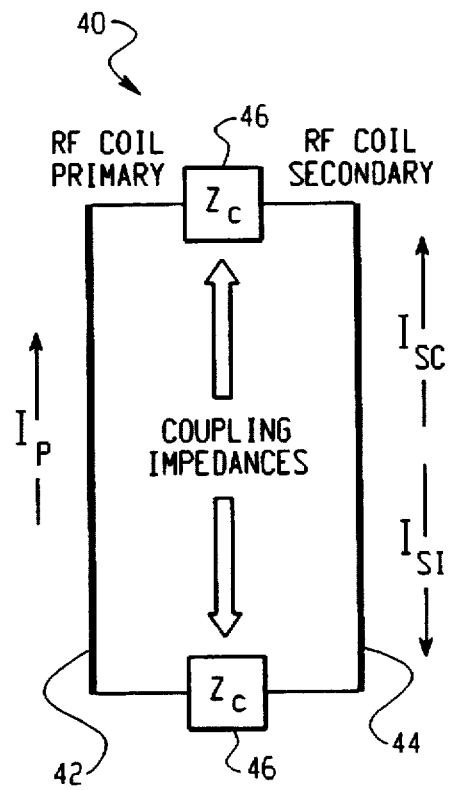
FIG. 3 is a block diagram of an RF coil in accordance with the present invention.

Referring initially to FIG. 3, an RF coil in accordance with the present invention is designated generally as RF coil 40. The RF coil 40 includes an RF coil primary 42, an RF coil secondary 44, and coupling impedances 46 that bridge the gap between the primary and secondary, physically and electrically. The RF coil primary 42 and secondary 44 may be resonant at any given frequency, or in some cases be designed to be non-resonant. The coupling impedances 46 are mostly reactive elements. The coupling impedances 46 may include an inductor. a capacitor. or a combination thereof as discussed below in relation to FIGS. 14a through 14d. The respective reactive elements can be fixed or variable and may be used to vary the currents in the RF coil primary 42 and/or secondary 44. to tune the entire RF coil

40. Also, the currents in the RF coil secondary 44 can be made either inductive ($I_{si}$), or capacitive ($I_{sc}$) depending on the values of the coupling impedances 46. Hence, by adjusting the values of the coupling impedances 46 it is possible to achieve a desired net effect on the performance of the RF coil primary 42 and hence the RF coil 40, such as to produce a symmetric or an asymmetric B field profile.

If the currents in the RF coil secondary 44 are inductive, then the secondary currents $_{si}$ will be in the opposite direction to that of the RF coil primary currents ($I_p$). Although, this will provide a net effect on the performance of the coil 40, there will be RF screening. The extent of this screening including the net effect on the S/N will depend on both $I_p$ and $I_{si}$.

Whereas if the currents in the RF coil secondary 44 are capacitive, then the secondary currents ISc will maintain the same direction as the RF coil primary currents $I_p$ and will provide a net effect on the performance of the coil 40. Here, there may be little or no RF screening. Depending on the current proportions in the RF coil primary 42 and secondary 44, the result will be a symmetric or an asymmetric B field profile.

If the currents in the RF coil secondary 44 are nulled, that is, if the currents in the secondary 44 are neither inductive nor capacitive, then the RF coil secondary 44 will have no net effect on the performance of the RF coil primary 42 and hence the coil 40. In some cases this may be necessary where the RF coil 40 is tuned to one or more frequencies.

For a single tuned case of a whole body RF transmit coil, for example, a large fraction of currents are induced on the secondary coil 44 which are opposite in direction of the currents of the RF coil primary 42. This will substantially reduce the overall coil performance. Here, the coupling impedances 46 can be varied such as to provide limited currents in the RF coil secondary 44. Predetermined limited currents in the RF coil secondary 44 will provide adequate screening without significantly affecting the performance of the RF coil primary 42 and hence the entire RF coil 40. This means the performance of the RF coil primary 42 will remain very close to that when operated without the RF coil secondary with respect to the imaging field of view. This will drastically reduce the amount of RF power expended in the patient, with RF power deposition being significantly below the prescribed Food & Drug Administration (FDA) limits for specific absorption rate (SAR). Also, this will significantly reduce the amount of RF power expended in the RF coil secondary 44 and hence the entire coil 40 during transmit.

As is explained in more detail below, the symmetric or asymmetric B field profile will facilitate a symmetric or an asymmetric overlap between coils in an array. This will assist in maintaining a high S/N and a high level of B field homogeneity over the imaging FOV.

The coupling impedances 46 may also be used to tune the RF coil 40 to a single or multiple NMR frequencies. To maintain a high S/N at the low gamma nucleus ($^{31}$p, $^{13}$C, $^{23}$Na, $^{17}$O, etc.), it is preferred that initially the RF coil primary 42 be tuned close to the low NMR frequency independent of the RF coil secondary 44 (i.e., with the RF coil secondary 44 open such that it has no net effect on the resonant frequency of the RF coil primary 42). In such a system, at the low frequency the RF coil secondary 44 will behave like a open circuit. At the high frequency, the RF coil primary 42 will behave like a short circuit to the high frequency currents while allowing them to flow through. In such cases the imaging or the spectroscopic FOV are equally spanned by the RF coil 40, since both the high and low frequency currents flow through the RF coil primary 42. As a result very similar B field profiles are created at the multiple NMR frequencies. This is extremely useful for obtaining $^1$H images, shimming, and for proton decoupling, all of which are important for obtaining spectroscopic information of the x-nucleus ($^{31}$p, $^{13}$C, $^{23}$Na, etc.).

Figure 1B:
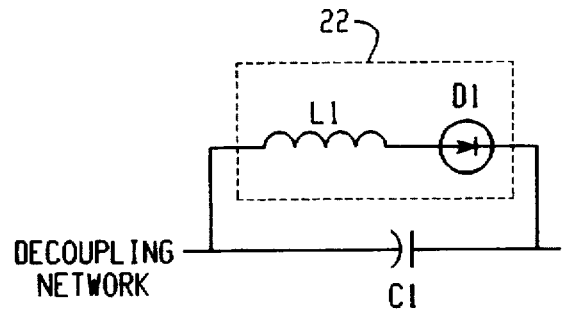
FIG. 1b is a schematic diagram of a conventional decoupling network.
Figure 4A:
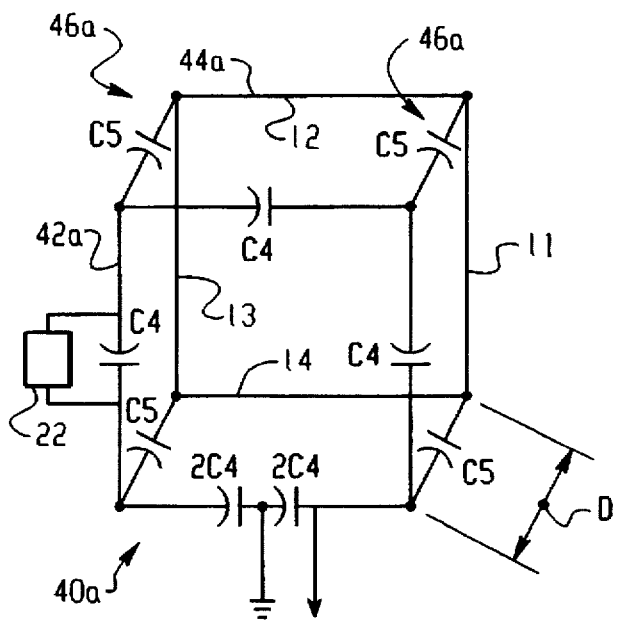
FIG. 4a is a schematic diagram of a linear surface type RF coil in accordance with a first embodiment of the present invention.
Figure 4B:
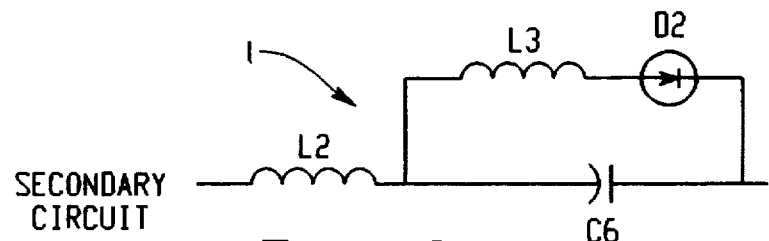

FIG. 4a illustrates a first preferred embodiment of an RF coil 40a. The RF coil 40a includes an loop type RF coil primary 42a, resonating with C4, and a loop type RF coil secondary 44a. The coupling impedances 46a are represented respectively by four C5 capacitors each of which may be fixed or variable. Each of the RF coil primary 42a and secondary 44a may be, for example, loops measuring 12 cm×17 cm in size. The secondary loop 44a may be resonant or non-resonant. In the illustrated embodiment case, the secondary loop 44a is non-resonant. The RF coil primary 42a and the RF coil secondary 44a are separated by a distance D of 2.0 cm. The RF coil primary 42a is actively decoupled using the decoupling network similar to that of FIG. 1b. The secondary 44a is made up four linear segments 1–14, each of which has a L2-C6-L3-D2 decoupling circuit I as represented in FIG. 4b. During transmit, the pin diode D2 is forward biased creating a trap and opening the segment, whereas during receive the L3-D2 circuit is open and the L2-C6 network is a short circuit at the NMR frequency. Typical values for L2-C6-L3 at 64 MHz for 1.5T are 124 nH, 50 pF and 124 nH, respectively. The voltage across 2C4 is matched to 50 ohms prior to the preamplifier. The entire coil system is tuned to 64 MHz, which happens to be the $^1$H frequency for a 1.5 Tesla $B_o$ field strength.

The currents in the RF coil secondary 44a may be altered by varying the C5 capacitors, which will also de-tune the coil 40a. The coil may then be fine tuned by using trimmer capacitors (not shown) across C4 or C5. Depending on the size of the RF coil 40a, the separation distance D between the primary 42a and secondary 44a, and the operating frequency, capacitors C4 or C5 may have greater control in the coil tuning. For this specific embodiment, C5 has been found to have greater control over the coil tuning. In other words, a slight variation in C5 resulted in a wide de-tuning of the entire coil 40a. However, the slight re-tuning of the coil 40a did not markedly alter the currents in the RF coil secondary 44a. Therefore, by fine tuning using a small value trimmer capacitor, adequate RF screening and precise tuning can be achieved. In all cases, the RF coil primary 42a and secondary 44a assume fixed positions, that is the RF coil primary and the RF coil secondary need not be physically moved to achieve the desired RF screening and tuning.

Should the coupling impedances 46a present a RF short between the RF coil primary 42a and secondary 44a, a larger fraction of currents will flow in the secondary and in this special case, the secondary currents will be inductive and in the opposite direction of the RF coil primary currents. However, should the coupling impedances 46a present an open circuit, the fraction of the currents in the RF coil secondary 44a will depend on the physical distance D between the primary 42a and the secondary 44a and on the resonance of the secondary. Since the distance is fixed in this case, a fixed relatively small fractional current will be present in the secondary 44a. This can be altered dramatically using the coupling impedances 46a mentioned above.

With such control over a large range without moving the secondary, the currents can be altered so as to maintain an adequate screening. Given the RF coil secondary 44a is fixed in location and placed at a suitable distance from the RF coil primary 42a, the effective RF screening can be achieved without significantly compromising the S/N over the imaging FOV. This is because the electrically forced currents (via adjustment of the coupling impedances 46a) in the secondary 44a (inductive in this case) have a minimal detrimental effect over the imaging FOV. The above is an example of a self-screening linear surface coil. It is noted that additional fine tuning can be carried out by adjusting one or more of the other sets of capacitors and inductors within the coil 40a.

Figure 5:
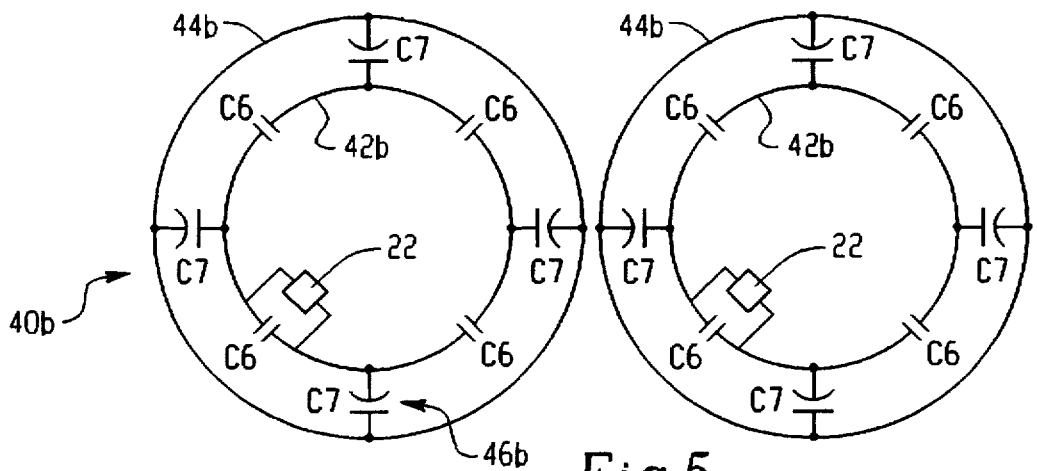
FIG. 5 is a schematic diagram of a linear loop array type RF coil in accordance with a second embodiment of the present invention.

FIG. 5 is a second preferred embodiment and is designed for uni- or bi-lateral breast imaging in an MRI system. Here two such circular loop solenoid type RF coil primaries 42b with capacitors C6 are connected to their respective non-resonant solenoid type RF coil secondaries 44b via coupling impedances 46b in the form of capacitors C7. It is noted that the RF coil secondaries 44b may be resonant as well, where a combination of the impedances in the coupling elements including the reactive impedances in the secondary will alter the currents in the RF coil. In this embodiment, the RF coil primaries 42b each have similar decoupling networks 22 of FIG. 1b. The secondaries 44b are equipped with similar decoupling networks of FIG. 4b (not shown). The currents in the RF coil secondaries 44b can be controlled to provide adequate screening between coils, between the coils and near by anatomy, and still provide high enough S/N in the imaging volume for reasons similar to those described above in connection with the embodiment of FIG. 4a. The left and right coils 40b can be turned ON or OFF selectively using the DC control lines from an MRI system, such that the coils are used to image in a uni-lateral or a bi-lateral fashion. Individual coils 40b are matched to 50 ohms and fed to the individual preamplifiers. This is an example of a surface coil array.

Turning now to FIG. 6, a quadrature surface coil 40c is shown in accordance with the third embodiment of the present invention. The primary RF coil 42c is a circular loop connected by eight straight segments to a virtual ground point VG1 at the primary coil center. Each of the eight segments are split by two capacitors C8, whereas the circular loop is split by four high value RF short capacitors C9. One of the two C8 capacitors is decoupled using a decoupling network (not shown) similar to that of FIG. 1b. The circular loop is split by very largesplit by very large value capacitors C9 to reduce any gradien currents, while letting RF currents flow. The RF coil secondary 44c is identical in dimension and is placed adjacent to the RF coil primary 42c, and maintains a common coil axis. The RF coil secondary 44c includes eight straight segments similar in orientation to the segments in the RF coil primary 42c. Each of the eight segments of the RF coil secondary 44c have L-C-L-D decoupling circuits similar to that of FIG. 4b. The loop of the RF coil secondary 44c is broken similar to the RF coil primary 42c, with high value RF shorting capacitors C10 (C10=C9=1000 picofarads (pF)). Both the RF coil primary 42c and secondary 44c maintain their own virtual ground points, VG1 and VG2, respectively. Eight C11 capacitors serve as the coupling impedances 46c which bridge the gap between the RF coil primary 42c and the secondary 44c and are azimuthally distributed along the coil periphery. The entire coil 40c has multiple frequency modes, and the principal quadrature mode is resonant at the NMR frequency.

The principle linear modes of this quadrature coil are matched to 50 ohms, prior to the preamplifier (not shown). The coupling ports A and B are shown in FIG. 6. The center conductor of these two coaxial cables are connected to capacitors across ports A and B, via reactive means to match the individual ports to 50 ohms. As seen, one of the points of these coupling ports A and B is forced to ground. Also, coaxial cables (not shown) exiting the RF coil primary at VG1 are tied to VG2, before exiting to the MRI system. This forces VG1 and VG2 to the system ground via the shields of the coaxial cables, which eliminates the need for cable traps and such mechanisms commonly used to reduce currents on the coaxial cable shields.

The currents in the RF coil secondary 44c may be altered similar to the above embodiments, that is by varying the coupling impedances 46c (C11). Also, the entire coil 40c may be fine tuned by doing the same. The two linear ports A and B are then combined using analog combiners prior to the preamplifier. These two ports may also be directly interfaced to two different channels of a multichannel system via individual preamplifiers. The currents in the RF coil primary 42c segments follow a cosinusoidal distribution. Since a fraction of these currents exist in the secondary 44c, and since all C11 values remain very close, the currents in the RF coil secondary 44c also follow a cosinusoidal distribution. For a detailed explanation of the theory of the RF coil primary design, please refer to the article by Srinivasan, et al, published in the 4th Scientific Meeting of the International Society of Magnetic Resonance in Medicine, Book of Abstracts, New York, Apr. 27–May 3, 1996, page 1425.

Figure 7:
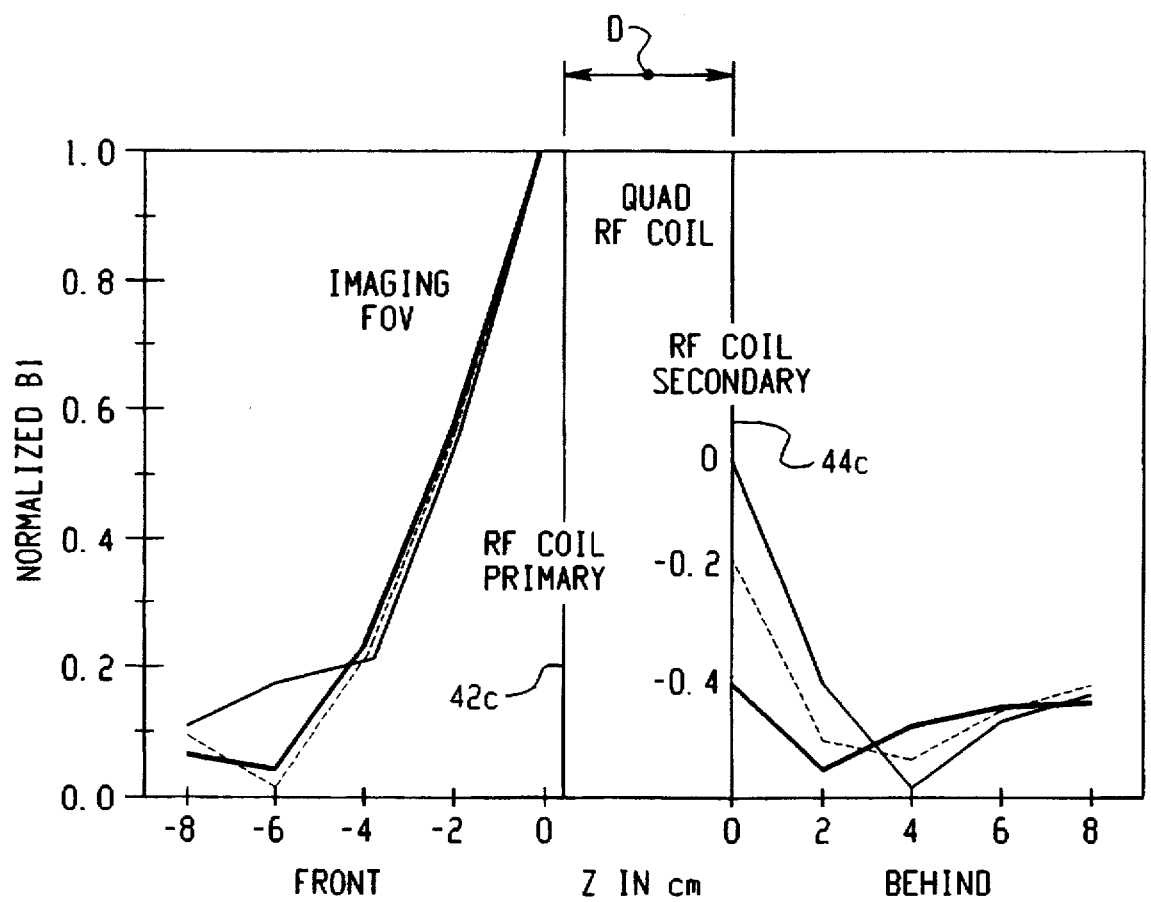
FIG. 7 represents a B field profile along the RF coil axis of FIG. 6.

Inductive currents in the RF coil secondary 44c can assist in accomplishing RF screening, where the RF coil 40c will maintain an asymmetric B field profile from one side of the coil 40c to another. FIG. 7 is a normalized B field simulation along the coil axis for different secondary currents for the design of FIG. 6. Coil dimensions are 22.5 cm in diameter, 8 legs and a primary 42c and secondary 44c separation distance D of 2 cm. As seen for $I_{si}=-0.4I_p$, the B field profile is highly asymmetric and the screening is greater than for $I_{si}=0$. The negative sign indicates that the inductive currents on the secondary are opposite to that of the primary $I_p$. Please note, $I_{si}=0$ is for a unscreened case for this specific coil design.

Figure 8A:
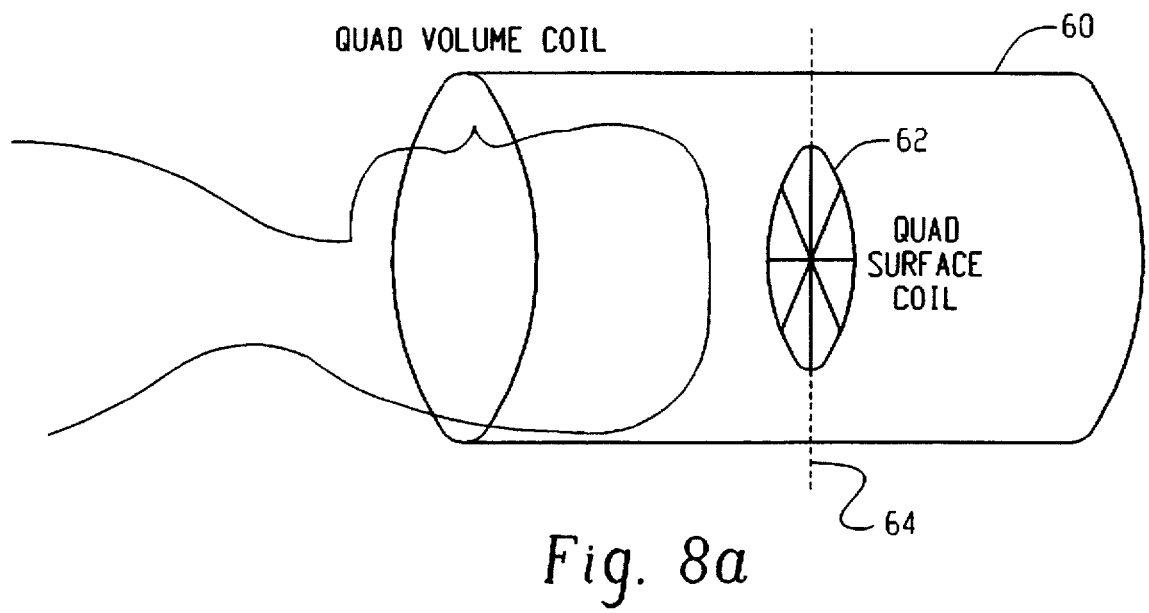
FIG. 8a is a diagrammatic view of a system providing symmetric overlap between a quadrature volume coil and a quadrature surface coil.

FIG. 8a illustrates an overlap between a volume coil 60 and a surface coil 62 which maintain a common axis. The surface coil 62 is of the quadrature type similar to the RF coil primary 42c of FIG. 6, whereas the volume coil 60 is of the quadrature birdcage type most commonly used for head imaging. Since the surface coil 62 is un-screened, this coil 62 will exhibit the same B field profile along the coil axis and on both the coil sides. Therefore, a suitable place where the cross-talk between the volume coil 60 and the surface coil 62 is kept to minimum is at the central virtual ground plane 64 of the volume coil 60. At this plane 64, the mutual coupling is virtually zero. That is, the flux coupling from one coil to the other is almost zero, and the coils 60 and 62 maintain minimum mutual inductance.

Figure 8B:
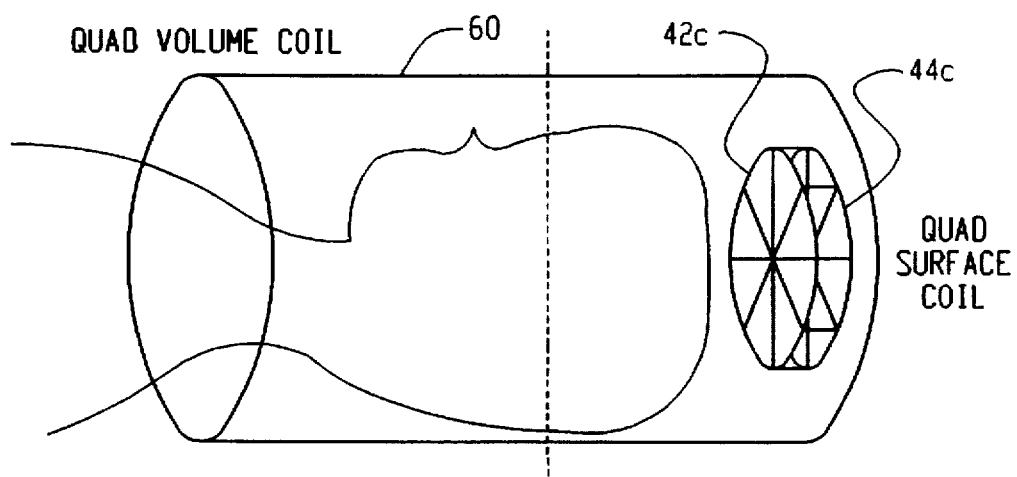
FIG. 8b is a diagrammatic view of a system providing asymmetric overlap between a quadrature volume coil and a quadrature surface coil in accordance with a fourth embodiment of the present invention.

As seen in FIG. 8a the coil array does not allow for placement of the entire head inside the volume coil 60. Also, the filling factor is markedly reduced which results in a reduced S/N. Accordingly, it is desirable that there be a coil design in which the surface coil can be placed off center and along the coil axis, such that the entire head can be placed inside the volume coil. In order to achieve this goal, the B field profile of the surface coil 60 has to be modified, that is the B field profile has to be asymmetric. This means that the RF field on one side of the surface coil and along the coil axis had to be screened to a certain extent. The asymmetric overlap can now be achieved with a surface coil that maintains an asymmetric B field profile along the coil axis as shown in FIG. 8b.

Specifically, the inventor has overlapped a surface coil 42c of the type described with respect to FIG. 6 with the birdcage type high-pass volume coil 60. The volume coil 60 has a 30 cm diameter and is 30 cm in length with sixteen legs connecting the two end rings. The surface coil 40c is a 22.5 cm diameter, 8 segment RF coil as represented in FIG. 6, having a 2.0 cm separation between the RF coil primary 42c and secondary 44c. The surface coil 40c, tuned for an asymmetric B field, can be placed to within 5 cm from one end ring of the birdcage volume coil 60. This allows an entire head to be placed inside the volume head coil from the other end of the coil 60, while still maintaining a high S/N and a high degree of B field homogeneity along all three planes of the coil. More specifically, a high S/N is obtained toward the top of the head ideal for MRI applications such as functional magnetic resonance imaging MRI and MR angiography where the focus is from the circle of willis to the top of the head.

Thus the asymmetric B field profile of the quadrature surface coil 40c facilitates an asymmetric overlap between volume and surface coils that maintain a common axis. The asymmetric profile mandates their degree of overlap. The greater the asymmetricity of the B field along the surface coil 40c axis, the smaller the overlap between the birdcage and the surface coil, and vice versa is also true. That is, the greater asymmetricity the smaller is the overlap where a minimal mutual inductance is easily attained, between the volume and surface coils in the array. Minimum mutual inductance will result in reduced noise correlation between coils in the array, and therefore will result in increased S/N in the combined image.

The quadrature birdcage coil 60 is interfaced to one channel and the quadrature surface coil 40c is interfaced to one other channel of a 1.5T multichannel MRI system (not shown). Alternatively, the birdcage coil 60 linear modes could be interfaced to two channels and the two linear modes of the surface coil could be interfaced to two other channels of the MRI system. FIG. 9 represents a fifth embodiment of the present invention. The RF coil 40d includes a primary RF coil 42d which is a 16 leg, birdcage volume coil of the low-pass configuration. Each of the 16 legs is broken by a C12 capacitor as shown more clearly in FIG. 10a. The RF coil 40d further includes an RF coil secondary 44d which is also a birdcage type volume coil, except has a larger diameter than the RF coil primary 42d while having the same length. The legs of the RF coil secondary 44d have no capacitors. The RF coil primary 42d and secondary 44d are bridged by 32 capacitors C13 serving as coupling impedances 46d, azimuthally distributed on both sides along the coil periphery. Not shown are capacitors that split the end rings of the RF coil primary 42d and secondary 44d, to reduce the gradient induced eddy currents. The coil 40d exhibits a multitude of frequency modes, but only two frequency quadrature modes are observed at the coil center. These are the two frequency modes where the coil is tuned and operated, simultaneously.

A coil 40d with a RF coil primary 42d of 18 cm diameter and a RF coil secondary 44d of 24 cm diameter was built by the inventor. The RF coil primary 42d and secondary 44d were each 19 cm long and had 16 legs each. The RF coil primary 42d was of the low-pass configuration. The RF coil secondary 44d was non-resonant. The capacitor C12 values were 68 pF, and the capacitor C13 values were 92 pF. The coil 40d was doubly tuned to 24.1 MHZ and 65.3 MHZ. These frequencies were close to 64 and 26 MHZ, for $^1$H and $^{31}$p at 1.5T. Therefore, the coil 40d could then be fine tuned with small additional capacitances, to tune to the respective NMR frequencies.

An individual repeating element of the coil of FIG. 9 is shown in FIG. 10a. It is noted that since this circuitry has five loops (one in the RF coil primary, one in the RF coil secondary and three joining both), eigen-value solutions for estimating the several frequency modes $\omega_k$ will be a fifth order equation. The individual repeating elements at both the low and high NMR frequencies are reflected in FIGS. 10b and 10c, respectively.

As represented from FIG. 10b, at 26 MHZ most of the currents circulate in the RF coil primary 42d, and the RF coil secondary 44d appeared substantially as an open circuit. A very small fraction of current circulated in the secondary 44d. This was confirmed by isolating the RF coil primary 42d from the coil system and the coil resonating at 25.7 MHZ. Since most of the low frequency currents circulate in the RF coil primary 42d, the efficiency at the low frequency will be similar to the single tune design. The low frequency coil may thus be modeled as shown in FIG. 10b.

At 64 MHZ, the RF coil primary 42d presents a short circuit letting all the high frequency currents to flow. Thus the RF coil 40d can be modeled similar to FIG. 10c, at the high NMR frequency.

Since the RF coil primary 42d carries a major fraction of both the high and low frequency currents, the RF coil 40d inventive design will maintain a similar FOV at both the NMR frequencies. This is essential for MR spectroscopy of $^1$H or other nuclei referred to above as the x-nucleus. Also, the sensitivity of the high NMR frequency will remain close to the single tune design. Thus, this design will maintain high efficiencies at both the NMR frequencies. Also, this coil design will allow simultaneous operation, which is essential for proton-decoupling and cross-polarization experiments.

It is noted that although the preferred embodiment has 16 legs in the RF coil secondary 44d, in another embodiment the coil may include a different number of legs, e.g., 8 legs. In yet another embodiment, the RF coil secondary 44d may be replaced with a solid or fine mesh RF screen. In either of such cases, the invention will still be resonant in quadrature at the two NMR frequencies. It is noted that a quadrature mode has two linear modes, which in turn can be tuned to different frequencies. Therefore the quadrature, double tuned birdcage design of FIG. 9 can be tuned and operated at four different NMR frequencies, simultaneously.

It is also noted that the coil 40d of FIG. 9 can be operated in a single tuned mode with RF screening. Such coil will find ready application for knee imaging, where the contralateral asymptomatic knee is close to the coil. A self-screened RF coil will allow for a free direction of frequency and phase encoding in NMR and will help reduce chemical shift and blood flow artifacts. This will improve the quality of the MR image, which in turn will assist the clinical diagnosis.

Figure 11:
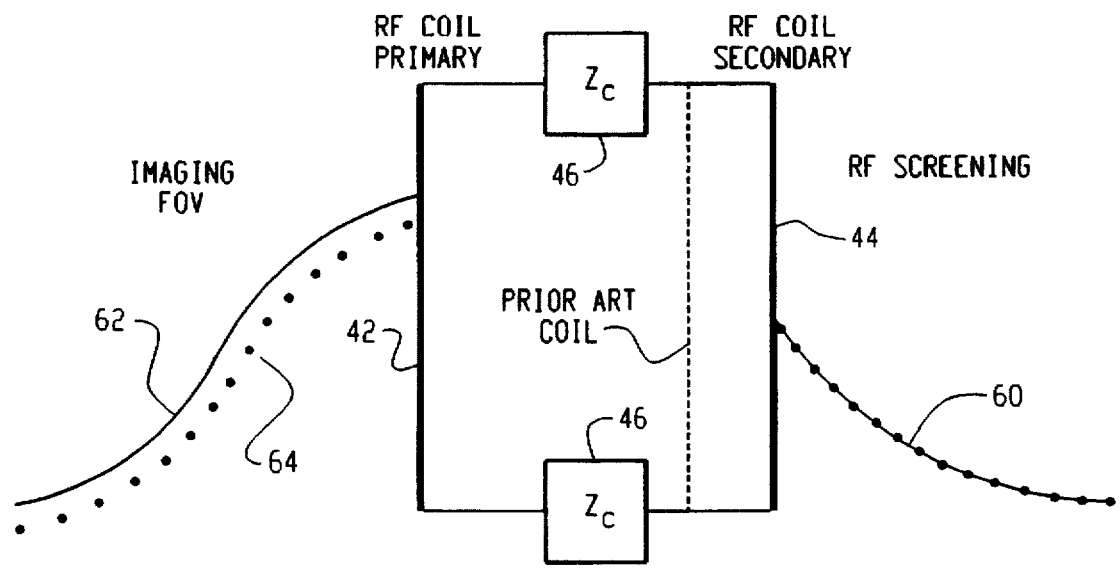
FIG. 11 is a graph illustrating the provision of adequate shielding without compromising S/N in the imaging FOV in accordance with an example of the prevent invention.
Figure 14A:
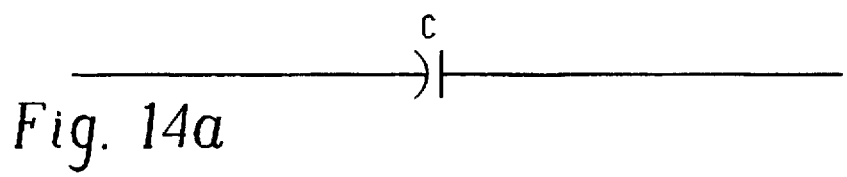
FIG. 14a–14d are exemplary coupling impedances in accordance with the present invention.
Figure 14B:
Figure 14C:
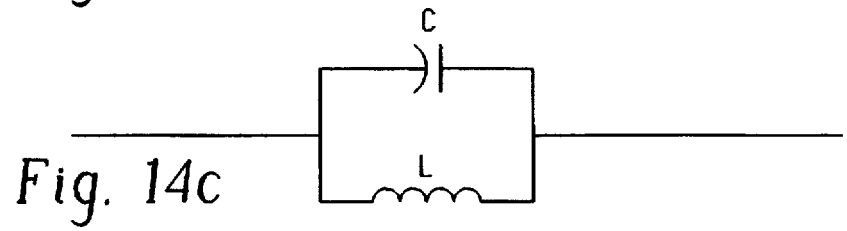
Figure 14D:
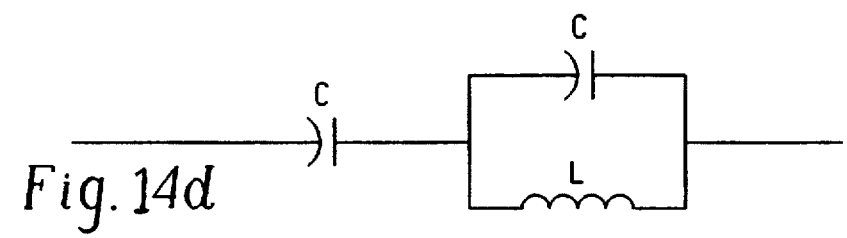

FIG. 11 is a B field profile illustrating an example of the effect the present invention has with regard to providing RF screening without sacrificing S/N over the FOV. Presume a prior art RF coil secondary is positioned relative to an RF coil primary 42 in order to provide equivalent screening (B field) as the RF coil secondary 44 with coupling impedances 46 as represented by curve 60. In each case the currents in the RF coil secondary are opposite in direction to the currents in the RF coil primary to provide RF screening. The inductive currents in the RF coil secondary for the prior art will be greater than the inductive currents of the RF coil secondary in the present invention. This will reduce the net effect on the S/N over the imaging FOV. The RF profile over the imaging FOV for the present invention is given by curve 62. The RF profile over the imaging FOV for the prior art arrangement is given by curve 64. Hence, given the same RF screening the present invention provides improved S/N over the imaging FOV.

Figure 12C:
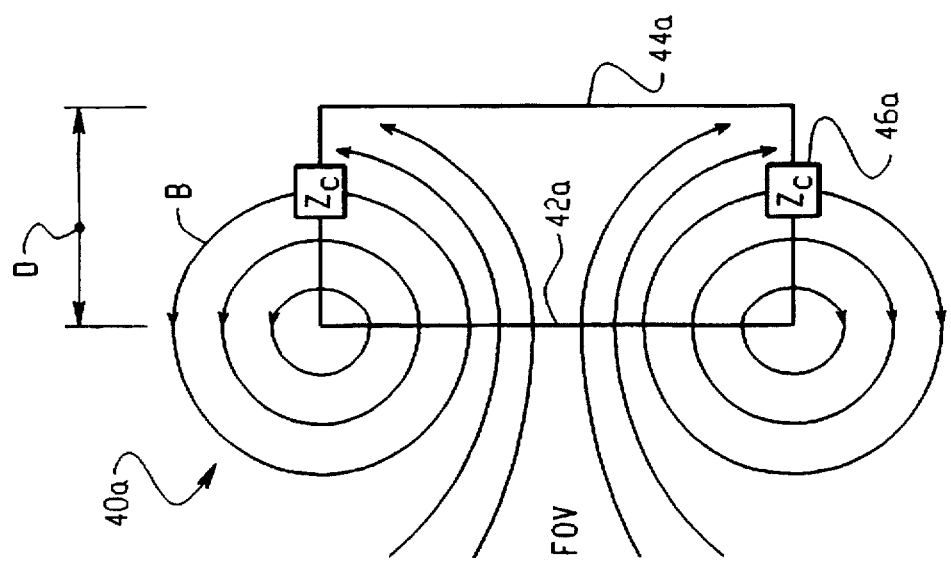
FIGS. 12a–12c are flux diagrams representing a conventional RF coil, an RF coil with conventional screening, and an RF coil in accordance with the present invention, respectively.
Figure 12B:
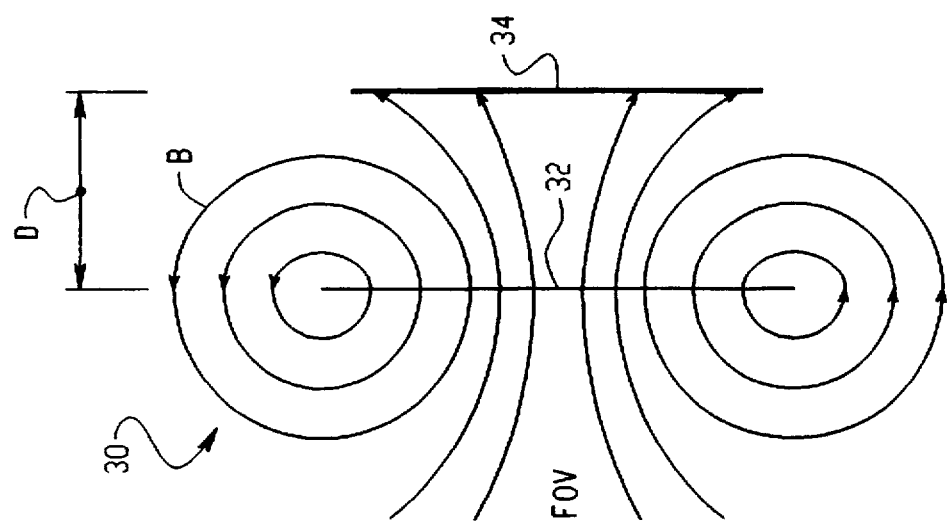
Figure 12A:
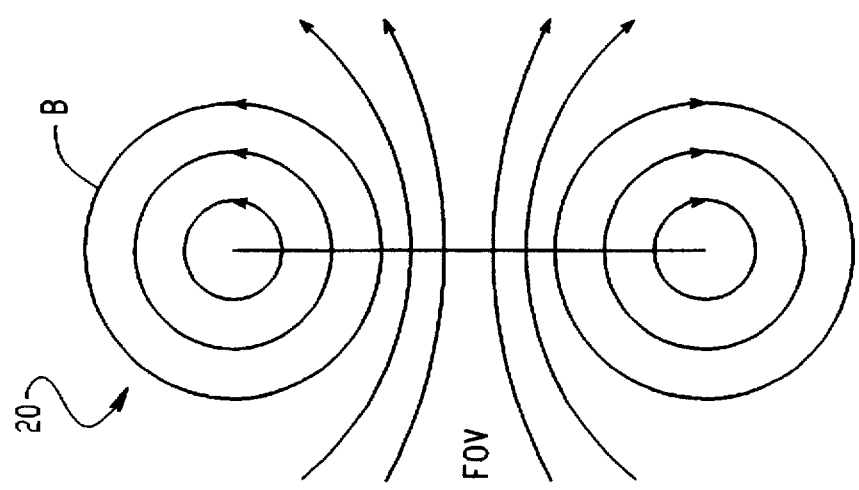

FIG. 12a presents a flux diagram for an unscreened RF coil 20 such as the type discussed above in connection with FIG 1a. As noted, the flux field lines B are identical on both sides of the coil 20. Here, there is no RF screening.

Figure 2:
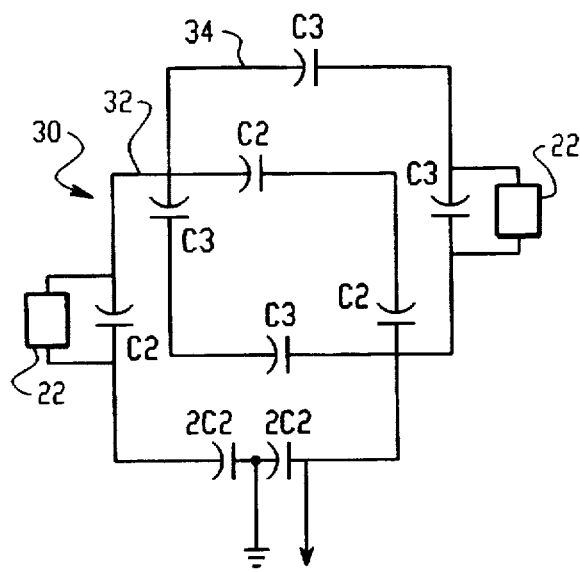
FIG. 2 is a schematic diagram of a conventional mutually coupled RF coil.

In comparison, FIG. 12b illustrates a flux diagram for an RF coil 30 such as the type shown in FIG. 2. As previously discussed, the RF coil primary 32 is mutually coupled through space to the RF coil secondary 34. RF currents will be induced in the secondary 34, which according to Lenz's Law, will oppose the very currents in the primary 32 which produced them. That is, the RF currents on the secondary 34 will be in the opposite direction to that of the primary 32; their proportion, however will be mandated by their proximity (e.g., distance D). In the case shown in FIG. 12b, the majority of the impinging flux B will terminate at the secondary 34. However, a small fraction will be diverted to the usable imaging coil FOV. The extent of the flux termination will also depend on the proximity of the secondary 34 to the primary 32. Although there will be screening on one side of the coil 30, the net flux in the usable imaging FOV will be reduced from the un-screened case of FIG. 12a. This will result in a reduced S/N in the imaging FOV.

FIG 12c exemplifies the utility of the present invention. FIG. 12c represents the flux diagram for an RF coil in accordance with the present invention such as the type shown in FIG. 4a above. In this case, the majority of the flux B is compressed between the primary 42a and the secondary 44a and is forced back into the usable imaging FOV. This is due to the currents circulating in the loops established by the coupling impedances 46a connecting the primary 42a and the secondary 44a. These currents maintain a direction such as to have their resultant B fields in the outward normal direction, which serve to force the flux B in such direction thus diverting their resultant B fields in to the usable FOV. A minority of flux will impinge on the secondary 44a, so as to provide screening. However, the amount of flux which impinges on the secondary 44a is substantially less than the amount of flux impinging on the secondary 34 in FIG. 12b when the respective primaries and secondaries are both a distance D apart.

Thus, according to the present invention by selecting the appropriate coupling impedances 46 between the primary and secondary it is possible to a) regulate the amount of induced currents in the secondary to provide adequate screening; and b) divert the remaining flux back into the usable imaging FOV. Consequently, it is possible to maintain a high S/N when compared to the prior art of FIG. 12b, for example, and close to the same S/N in the unscreened case as in FIG. 12a. It is noted that the S/N for the invention will be slightly lower than the un-screened case due to loss of flux in the secondary to provide RF screening. However, the combination of RF screening and S/N is superior than in either conventional coil.

Figure 13:
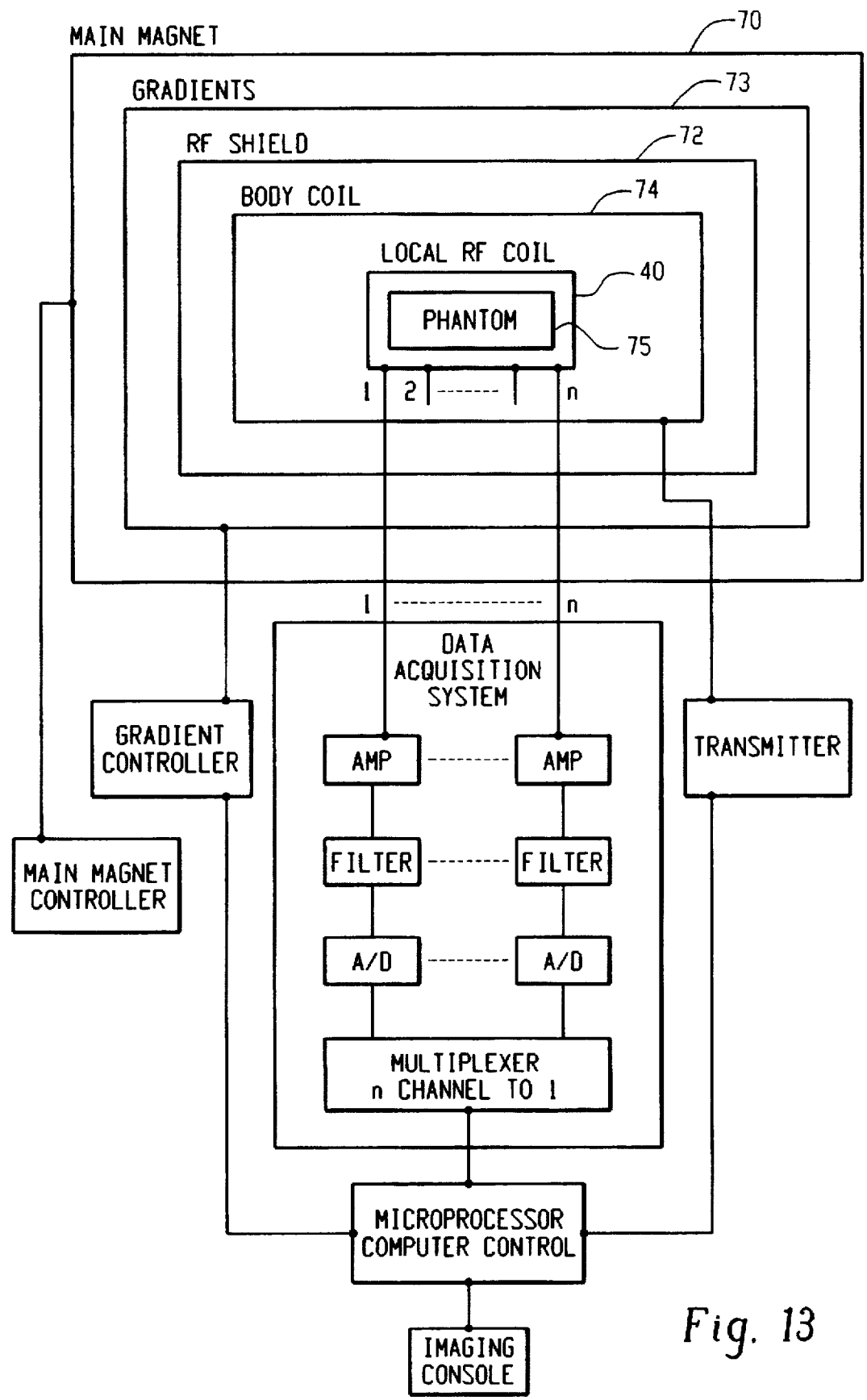
FIG. 13 is a system diagram of a NMR imaging system incorporating an RF coil in accordance with the present invention.

The system block diagram of FIG. 13 illustrates the utility of the RF coil 40 of the present invention in NMR imaging, for example. The system has a main magnet 70 which covers the time varying gradient coils, an RF shield 72 that shields the RF coil from the gradient coils 73 and a whole-body RF coil 74 most commonly used for uniform B field transmit over a large imaging FOV. The main magnet field strength sets the NMR frequency. The time varying magnetic fields help spatially encode the NMR signals. The RF whole body coil 74 is used to transmit, while the local RF coil 40 is used to pick up the NMR signals from the object under investigation (NMR phantom 75). A number of receiver coils may be used in an array configuration in the RF coil 40 and may be summed either analog or digitally to produce the resultant image. Signals from the i several receiver ports may be acquired via one or multiple receiver channels. An n to 1 channel multiplexer is shown in the drawing. This helps by-pass n channel coil data to use one channel of the NMR system. Alternatively, an n channel NMR system may also be used.

FIGS. 14a through 14d illustrate different examples of the types of circuits which can be used as the coupling impedances 46. The various parallel/series relationships of the reactive elements can be selected based on the desired properties. One or more of the elements can be variable to allow for tuning as desired.

It will be appreciated based on the proceeding description that the net or resultant current in the RF coil secondary 44 can be inductive, capacitive or neither (i.e., nulled). The B field of the RF coil 40 can be symmetric or asymmetric along the axis of the coil. Volume and surface coils can be symmetrically or asymmetrically overlapped to maintain minimum mutual inductance.

Although the invention has been shown and described with respect to certain preferred embodiments, it is obvious that equivalents and modifications will occur to others skilled in the art upon the reading and understanding of the specification. For example, after reading the above disclosure it will be apparent to someone having ordinary skill in the art that the ability to vary the current in the RF coil primary and secondary can be applied to almost all surface and volume type coils for use in NMR. Examples of the linear and quadrature coil types are loop type, FIG. 8 type, solenoidal type, saddle type, distributed inductance-capacitance type, birdcage type, loop gap resonator type, etc.

It is also noted that there may be more than one RF coil secondary in a design, the multiple secondaries being coupled to the RF coil primary via a common or independent set of coupling impedances. Furthermore, it is noted that the coil designs may be of the low-pass, high-pass, or band-pass variety or their combination. Also, the coils can be singly tuned or multiply tuned or may be used independently or in an array configuration. Principal k=1 modes or higher order k>1 modes may be tuned to the NMR frequency. Inductive magnetic coupling or electrical coupling may be used to match the individual modes of the coil to 50 ohms.

The coils may also be used for transmit only, for receive only, or for both transmit and receive of NMR signals. Furthermore, the RF coil can be used for other techniques such as electron spin resonance, nuclear quadruple resonance, etc. The coils may be used alone or in conjunction with local gradient set up for high resolution and rapid imaging.

Also, the shape and form of the RF coil can be adapted to the surface or volume under investigation. The RF coil primary and the RF coil secondary may be resonant or non-resonant. The RF coil secondary also may be a non-resonant solid or fine mesh RF screen. The RF coil secondary may be of a different shape and design than the RF coil primary. The impedance coupling network may be reactive or resistive, or a combination of both.

Preferably the RF coil primary and secondary are made of copper, either etched to a rigid or a flexible printed circuit board, or used as a milled copper sheet of definite thickness. Copper tubes may also be employed depending on the use of purpose including the product packaging needs. For example, the whole body RF coil is generally made of copper tubes, whereas the surface coil is normally etched on a flexible printed circuit board. It is noted that the RF coils may be covered with a precious metal to enhance their performance, and to minimize or eliminate the oxidation of copper over time. Tin is used to reduce or eliminate the oxidation of copper, however tin does not enhance the coil performance. The RF coils may be coated with precious metals such as silver, gold or platinum, etc., which have increased conductivity, to help reduce the resistance and increase the Q factor of a RF coil ($Q=\omega L/R$). Since S/N is proportional to the square root of the coil Q, any increase in Q will result in an increase in the coil S/N and will result in a lower transmitter power needed for the same experiment.

The degrees of freedom in coil design are its shape, including the diameter, coil length, number of legs and the separation between the primary and secondary. An additional degree of freedom in coil design is the ability to control the currents in the RF coil primary and secondary, such as to provide adequate RF screening without significantly compromising S/N over the imaging FOV. This will also facilitate asymmetric overlap between volume and surface coils including multiple tuning of this novel structure.

The present invention includes all such equivalents and modifications, and is limited only by the scope of the following claims.

What is claimed is:

1. A radio-frequency (RF) coil for resonance imaging/analysis, comprising:
    an RF coil primary sensitive to RF signals produced during resonance imaging/analysis, the RF coil primary having a usable field of view;
    an RF coil secondary positioned physically adjacent the RF coil primary at a predetermined distance apart and mutually coupled to the RF coil primary at a frequency of the RF signals; and
    coupling impedances electrically connecting the RF coil primary to the RF coil secondary to regulate an amount of current induced in the RF coil secondary at the frequency to provide screening relative to the RF coil primary, and to form current loops between the RF coil primary and the RF coil secondary serving to redirect at least a substantial portion of flux back into the useable field of view which would otherwise impinge on the RF coil secondary in the absence of the coupling impedances.

2. The RF coil of claim 1, wherein the RF primary and secondary coils each comprise a planar loop type coil.

3. The RF coil of claim 2, wherein the loop type coils of the RF primary and secondary coils are respectively oriented in parallel planes.

4. The RF coil of claim 3, wherein the loop type coils are rectangular.

5. The RF coil of claim 3, wherein the loop type coils are circular.

6. The RF coil of claim 3, wherein the RF coil is a quadrature coil.

7. The RF coil of claim 1, wherein the RF coil secondary is resonant.

8. The RF coil of claim 1, wherein the RF coil primary comprises a planar coil having an axis substantially perpendicular to the plane thereof, and a magnetic B field profile of the RF coil at the frequency is asymmetric along the axis.

9. The RF coil of claim 1, wherein the RF primary and secondary coils each comprise a volume type coil.

10. The RF coil of claim 9, wherein the volume type coils are each birdcage type coils.

11. A resonance imaging/analysis system, comprising:
    an RF coil as recited in claim 1; and
    means for processing RF signals which are at least one of received from the RF coil and transmitted from the RF coil in order to obtain a resonance image/analysis.

12. A multiple tuned RF coil, comprising:
    an RF coil primary having a usable field of view;
    an RF coil secondary physically adjacent the RF coil primary and mutually coupled to the RF coil primary; and
    coupling impedances electrically connecting the RF coil primary to the RF coil secondary to regulate an amount of current flowing between the RF coil primary and the RF coil secondary, wherein the RF coil is tuned to resonate at a plurality of different RF signal frequencies produced during resonance imaging/analysis.

13. The RF coil of claim 162 wherein a B field profile in the usable field of view is substantially similar at the plurality of different RF signal frequencies.

14. The RF coil of claim 12, wherein the RF coil primary represents substantially an RF short circuit at one of the plurality of different frequencies and the RF coil secondary represents substantially an RF open circuit at another of the plurality of different frequencies.

15. The RF coil of claim 12, wherein the RF coil secondary is non-resonant.

16. The RF coil of claim 12, wherein the RF coil secondary functions as an RF screen.

17. A radio-frequency (RF) coil for resonance imaging/analysis, comprising:
    an RF coil primary sensitive to RF signals produced during resonance imaging/analysis, the RF coil primary having a usable field of view;
    an RF coil secondary positioned physically adjacent the RF coil primary at a predetermined distance apart and mutually coupled to the RF coil primary at a frequency of the RF signals; and
    coupling impedances electrically connecting the RF coil primary to the RF coil secondary to regulate an amount of current induced in the RF coil secondary at the frequency, and to form current loops between the RF coil primary and the RF coil secondary serving to redirect at least a substantial portion of flux back into the useable field of view which would otherwise impinge on the RF coil secondary in the absence of the coupling impedances.

* * * * *